(12) United States Patent
Sipinski et al.

(10) Patent No.: US 9,077,365 B2
(45) Date of Patent: Jul. 7, 2015

(54) APPLICATION SPECIFIC INTEGRATED CIRCUIT INCLUDING A MOTION DETECTION SYSTEM

(75) Inventors: Gene Sipinski, Elgin, IL (US); Joel Bertomeu, Valencia (ES); Juan Gavillero, Valencia (ES); Rafael Serrano-Gotarredona, Valencia (ES)

(73) Assignee: S.C. Johnson & Son, Inc., Racine, WI (US)

( * ) Notice: Subject to any disclaimer, the term of this patent is extended or adjusted under 35 U.S.C. 154(b) by 1264 days.

(21) Appl. No.: 12/905,946

(22) Filed: Oct. 15, 2010

(65) Prior Publication Data

US 2012/0091219 A1   Apr. 19, 2012

(51) Int. Cl.
| | |
|---|---|
| *B05B 12/12* | (2006.01) |
| *H03M 1/18* | (2006.01) |
| *B65D 83/26* | (2006.01) |
| *B65D 83/38* | (2006.01) |

(52) U.S. Cl.
CPC ............. *H03M 1/181* (2013.01); *B05B 12/122* (2013.01); *B05B 12/12* (2013.01); *B05B 12/124* (2013.01); *B65D 83/262* (2013.01); *B65D 83/386* (2013.01)

(58) Field of Classification Search
CPC ...... B05B 12/12; B05B 12/122; B05B 12/124
USPC .......................................... 239/67, 69, 71, 73
See application file for complete search history.

(56) References Cited

U.S. PATENT DOCUMENTS

| | | | |
|---|---|---|---|
| 3,813,540 | A | 5/1974 | Albrecht |
| 4,063,664 | A | 12/1977 | Meetze, Jr. |
| 4,462,670 | A | 7/1984 | Maida |
| 4,671,435 | A | 6/1987 | Stout et al. |
| 4,736,097 | A | 4/1988 | Philipp |
| 4,830,791 | A | 5/1989 | Muderlak et al. |
| 4,902,887 | A | 2/1990 | Everett, Jr. |
| 4,967,395 | A | 10/1990 | Watanabe et al. |

(Continued)

FOREIGN PATENT DOCUMENTS

| | | |
|---|---|---|
| CN | 1124534 | 6/1996 |
| CN | 1163556 | 10/1997 |

(Continued)

OTHER PUBLICATIONS

PCT/US2011/001747 International Search Report dated Mar. 22, 2012.

(Continued)

*Primary Examiner* — Ryan Reis

(57) ABSTRACT

An integrated circuit includes a detector having a detecting device that detects a proximity condition and develops a parameter of electric power related thereto and a parameter measuring device coupled to the detecting device. The parameter measuring device comprises a parameter detector, and an analog-to digital converter (ADC) coupled to the parameter detector and operative in one of a plurality of operational ranges to develop a digital representation of the parameter. The parameter measuring device further includes a range selector coupled between the ADC and the parameter detector that is operative to cause the parameter detector to develop an output signal magnitude representative of the parameter of electric power wherein the output signal magnitude is within one of the operational ranges of the ADC. The detector may be used in a control for a spray device to detect motion.

11 Claims, 10 Drawing Sheets

(56) References Cited

U.S. PATENT DOCUMENTS

| | | | |
|---|---|---|---|
| 4,973,833 A | 11/1990 | Takada et al. | |
| 4,989,755 A | 2/1991 | Shiau | |
| 5,015,994 A | 5/1991 | Hoberman et al. | |
| 5,134,961 A | 8/1992 | Giles et al. | |
| 5,392,768 A | 2/1995 | Johansson et al. | |
| 5,397,028 A | 3/1995 | Jesadanont | |
| 5,487,502 A | 1/1996 | Liao | |
| 5,499,016 A | 3/1996 | Pantus | |
| 5,591,409 A | 1/1997 | Watkins | |
| 5,647,388 A | 7/1997 | Butler, Jr. et al. | |
| 5,695,091 A | 12/1997 | Winings et al. | |
| 5,699,243 A | 12/1997 | Eckel et al. | |
| 5,730,165 A * | 3/1998 | Philipp | 137/1 |
| 5,862,844 A | 1/1999 | Perrin | |
| 5,895,986 A | 4/1999 | Walters et al. | |
| 5,908,140 A | 6/1999 | Muderlak | |
| 6,039,212 A | 3/2000 | Singh | |
| 6,050,016 A | 4/2000 | Cox | |
| 6,151,529 A * | 11/2000 | Batko | 700/28 |
| 6,264,548 B1 | 7/2001 | Payne, Jr. et al. | |
| 6,331,832 B1 * | 12/2001 | Rushing | 341/139 |
| 6,347,414 B2 | 2/2002 | Contadini et al. | |
| 6,390,453 B1 | 5/2002 | Frederickson et al. | |
| 6,394,310 B1 | 5/2002 | Muderlak et al. | |
| 6,433,329 B1 * | 8/2002 | Butka et al. | 250/221 |
| 6,517,009 B2 | 2/2003 | Yahav | |
| 6,554,203 B2 | 4/2003 | Hess et al. | |
| 6,593,701 B1 | 7/2003 | Hsieh | |
| 6,644,507 B2 | 11/2003 | Borut et al. | |
| 6,698,616 B2 | 3/2004 | Hidle et al. | |
| 6,722,529 B2 | 4/2004 | Ceppaluni et al. | |
| 6,888,323 B1 | 5/2005 | Null et al. | |
| 6,981,499 B2 | 1/2006 | Anderson et al. | |
| 7,011,795 B2 | 3/2006 | Thompson et al. | |
| 7,242,332 B1 | 7/2007 | Beomler | |
| 7,296,765 B2 | 11/2007 | Rodrian | |
| 7,339,471 B1 | 3/2008 | Chan et al. | |
| 7,355,349 B2 * | 4/2008 | Evans | 315/149 |
| 7,538,473 B2 | 5/2009 | Blandino et al. | |
| 7,597,308 B1 | 10/2009 | Stucki | |
| 7,597,309 B1 | 10/2009 | Stucki | |
| 7,610,118 B2 | 10/2009 | Schramm et al. | |
| 7,665,673 B2 | 2/2010 | Hagleitner | |
| 7,687,744 B2 | 3/2010 | Walter et al. | |
| 7,723,899 B2 | 5/2010 | Blandino et al. | |
| 7,740,395 B2 | 6/2010 | Samuel et al. | |
| 2004/0074935 A1 | 4/2004 | Chon | |
| 2006/0076366 A1 * | 4/2006 | Furner et al. | 222/402.13 |
| 2007/0023540 A1 | 2/2007 | Selander | |
| 2007/0036673 A1 | 2/2007 | Selander | |
| 2007/0046143 A1 | 3/2007 | Blandino et al. | |
| 2007/0199952 A1 | 8/2007 | Carpenter et al. | |
| 2009/0185952 A1 | 7/2009 | Bankers et al. | |
| 2009/0289127 A1 | 11/2009 | Tollens et al. | |
| 2009/0309717 A1 | 12/2009 | Sipinski et al. | |
| 2010/0243673 A1 | 9/2010 | Furner et al. | |
| 2010/0243674 A1 | 9/2010 | Furner et al. | |
| 2011/0062895 A1 * | 3/2011 | Ji | 315/309 |

FOREIGN PATENT DOCUMENTS

| | | |
|---|---|---|
| CN | 1219720 | 6/1999 |
| CN | 1361743 | 7/2002 |
| CN | 1496935 | 5/2004 |
| CN | 1578911 | 2/2005 |
| CN | 1605032 | 4/2005 |
| CN | 1625841 | 6/2005 |
| CN | 1675600 | 9/2005 |
| CN | 1711387 | 12/2005 |
| CN | 1720555 | 1/2006 |
| CN | 1739123 | 2/2006 |
| CN | 1761984 | 4/2006 |
| CN | 1781250 | 5/2006 |
| CN | 1792037 | 6/2006 |
| CN | 1854027 | 11/2006 |
| CN | 1902500 | 1/2007 |
| CN | 1910315 | 2/2007 |
| CN | 1910316 | 2/2007 |
| CN | 1910319 | 2/2007 |
| CN | 1918707 | 2/2007 |
| CN | 1947336 | 4/2007 |
| CN | 101065299 | 10/2007 |
| CN | 101069269 | 11/2007 |
| CN | 101093255 | 12/2007 |
| CN | 101124680 | 2/2008 |
| CN | 101142735 | 3/2008 |
| CN | 101208998 | 6/2008 |
| CN | 101371564 | 2/2009 |
| CN | 101529878 | 9/2009 |
| CN | 101534868 | 9/2009 |
| CN | 101557837 | 10/2009 |
| CN | 101558372 | 10/2009 |
| CN | 101604504 | 12/2009 |
| CN | 201361455 | 12/2009 |
| CN | 101678948 A | 3/2010 |
| CN | 101803368 A | 8/2010 |
| CN | 101822126 | 9/2010 |
| CN | 101828327 | 9/2010 |
| CN | 101836181 | 9/2010 |
| GB | 2248888 | 4/1992 |
| GB | 2305261 | 4/1997 |
| JP | 7320770 A | 11/1992 |
| WO | 9310910 | 6/1993 |

OTHER PUBLICATIONS

Web Page http://www.glade.com/productDetailPage.aspx?productId=23 dated 2010 (1 page).

International Search Report Dated Dec. 16, 2009 Appl. No. PCT/US2009/003453.

* cited by examiner

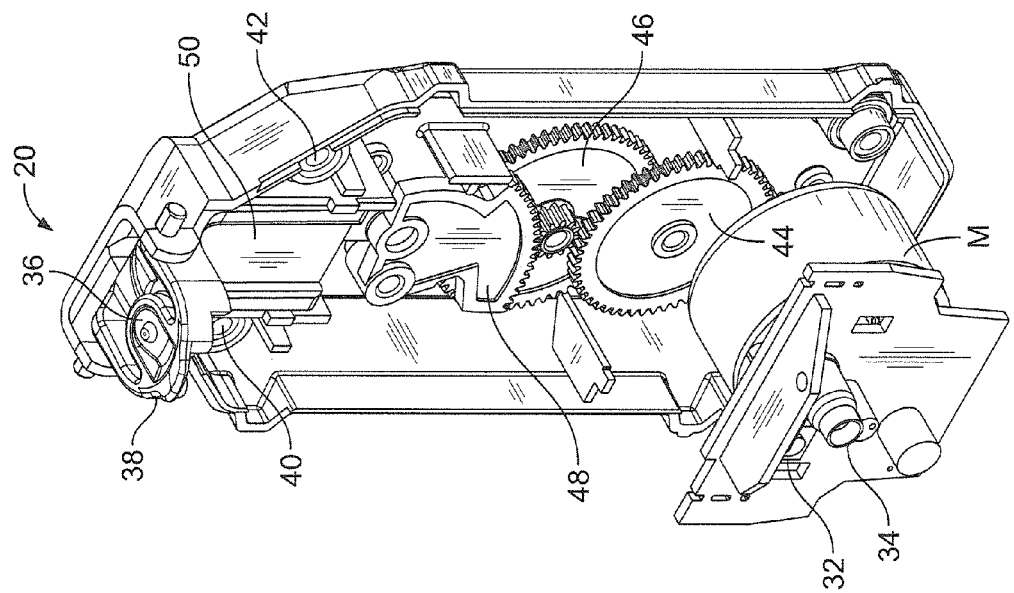
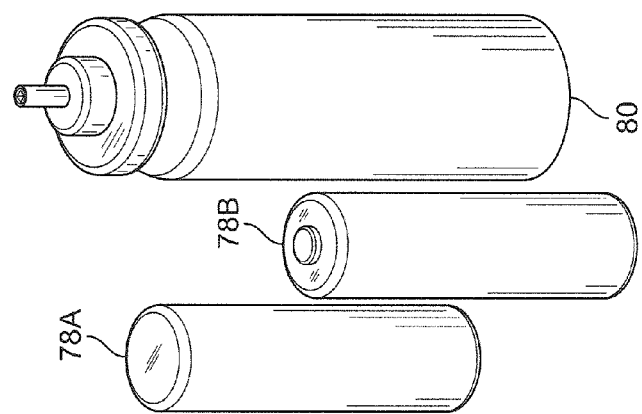
FIG. 2

APPLICATION SPECIFIC INTEGRATED CIRCUIT INCLUDING A MOTION DETECTION SYSTEM

CROSS REFERENCE TO RELATED APPLICATIONS

None.

REFERENCE REGARDING FEDERALLY SPONSORED RESEARCH OR DEVELOPMENT

Not applicable

SEQUENTIAL LISTING

Not applicable

BACKGROUND OF THE INVENTION

1. Field of the Background

The present invention relates generally to controllers using detection devices, and, more particularly, to an integrated circuit having a detection system for detecting motion, for example, of an individual.

2. Description of the Background

Diffusion devices or dispensers are used to dispense volatile materials, such as perfumes, deodorizers, insecticides, insect repellents, and the like. Many such devices are passive diffusion devices that require only ambient air flow to dispense the volatile material, while other devices are active diffusion devices. Active diffusion devices are found in a variety of forms—some include fans and/or heaters to aid in the dispersal of volatile materials, others actuate a valve stem of an aerosol container to dispense a volatile material contained therein, still others utilize an ultrasonic transducer to break up a liquid volatile material into droplets that are ejected from the device, and yet others include any combination of the above or any other known type of active diffusion device. Various examples of such devices can be found in Helf et al. U.S. patent application Ser. No. 11/401,572, Beland et al. U.S. patent application Ser. No. 11/801,554, Helf et al. U.S. patent application Ser. No. 11/893,456, Helf et al. U.S. patent application Ser. No. 11/893,476, Helf et al. U.S. patent application Ser. No. 11/893,489, Helf et al. U.S. patent application Ser. No. 11/893,532, Sipinski et al. U.S. patent application Ser. No. 12/080,336, Sipinski et al. U.S. patent application Ser. No. 12/157,705, Pedrotti et al. U.S. Pat. No. 6,917,754, and Schwarz U.S. Pat. No. 7,540,473, all of which are incorporated herein by reference in their entireties.

Further, some known active diffusion devices are operated strictly on a timed basis, and others are operated in response to a sensed parameter indicative of the presence or absence of a condition. An example of a device operated in accordance with the latter methodology includes a spray control incorporating a phototransistor that senses light levels in the vicinity of the device in turn to detect the presence of an individual in a space occupied by the device. The device dispenses volatile material in response to such detection. Still other devices dispense a volatile material based on a combination of a timed basis and a sensed condition.

A volatile material dispensing device has been offered for sale and sold by the assignee of the instant application including a programmable controller and discrete electrical components that together act as a motion sensor and a motor controller. The motor controller comprises a number of transistors connected in an H-bridge configuration with the motor winding being coupled across output junctions of the H-bridge. Sensing and control components are connected to the H-bridge. The motion sensor included a phototransistor and a voltage amplifier that developed an output signal representing changes in the collector current of the phototransistor. An LED driver circuit was also provided that illuminated an LED at selected times. This device includes a relatively large number of discrete electrical components that are needed to implement the various sensing and control functions of the device.

Sipinski et al. U.S. Patent Application Publication No. 2009/0309717 is directed to a device that includes a motion sensing circuit utilized within a dispenser to dispense a volatile material. The sensor utilizes a phototransistor circuit 60 as illustrated in FIG. 5 of such application including a phototransistor U1.

Blandino et al. U.S. Pat. Nos. 7,538,473 and 7,723,899 disclose drive circuits including a motion sensor for a piezoelectric actuator or an ultrasonic atomizer.

Furner et al. U.S. Patent Application Publication Nos. 2010/0243673 and 2010/0243674 are directed to compact spray devices that utilize a photocell motion sensor or other commercially available motion detectors.

Carpenter et al. U.S. Patent Application Publication No. 2007/0199952 describes a compact spray device that utilizes various types of motion sensors.

Selander U.S. Patent Application Publication Nos. 2007/0023540 and 2007/0036673 describe the use of a fragrance delivery system employing a motion detector.

SUMMARY OF THE INVENTION

In accordance with one aspect of the present invention, a detector includes a detecting device that detects a proximity condition and develops a parameter of electric power related thereto and a parameter measuring device coupled to the detecting device. The parameter measuring device comprises a parameter detector, and an analog-to digital converter (ADC) coupled to the parameter detector and operative in one of a plurality of operational ranges to develop a digital representation of the parameter. The parameter measuring device further includes a range selector coupled between the ADC and the parameter detector that is operative to cause the parameter detector to develop an output signal magnitude representative of the parameter of electric power wherein the output signal magnitude is within one of the operational ranges of the ADC.

According to another aspect, an integrated circuit is operable in response to a sensed condition, and includes a motor controller, a plurality of input terminals coupled to a source of power, and a plurality of output terminals for connection to a motor. The integrated circuit further includes a motion detector for receiving a signal developed by a photosensitive device and means for operating the motor in one of a plurality of operating modes responsive to motion detected by the motion detector.

According to yet another aspect, a volatile dispensing device includes a motor, a volatile material container, and an LED wherein the volatile dispensing device operates in response to elapsed time and sensed motion. The volatile dispensing device includes a source of power and an application specific integrated circuit (ASIC). The ASIC has a motor controller for supplying current to the motor, a plurality of input terminals coupled to the source of power, a plurality of output terminals coupled to the motor controller for connection to the motor, a motion detector for receiving a signal developed by the photosensitive device, and means for operating the motor and the LED in one of a plurality of operating modes responsive to motion detected by the motion detector. The volatile dispensing device further includes a photosensitive device coupled to the motion detector and the ASIC is responsive to the photosensitive device to detect motion.

Other aspects and advantages will become apparent upon consideration of the following detailed description and the attached drawings, in which like elements are assigned like reference numerals.

BRIEF DESCRIPTION OF THE DRAWINGS

FIG. 2 comprises an isometric view of an embodiment of a volatile material dispenser wherein batteries and a fluid container are omitted therefrom;

DETAILED DESCRIPTION OF THE DRAWINGS

Figure 1:
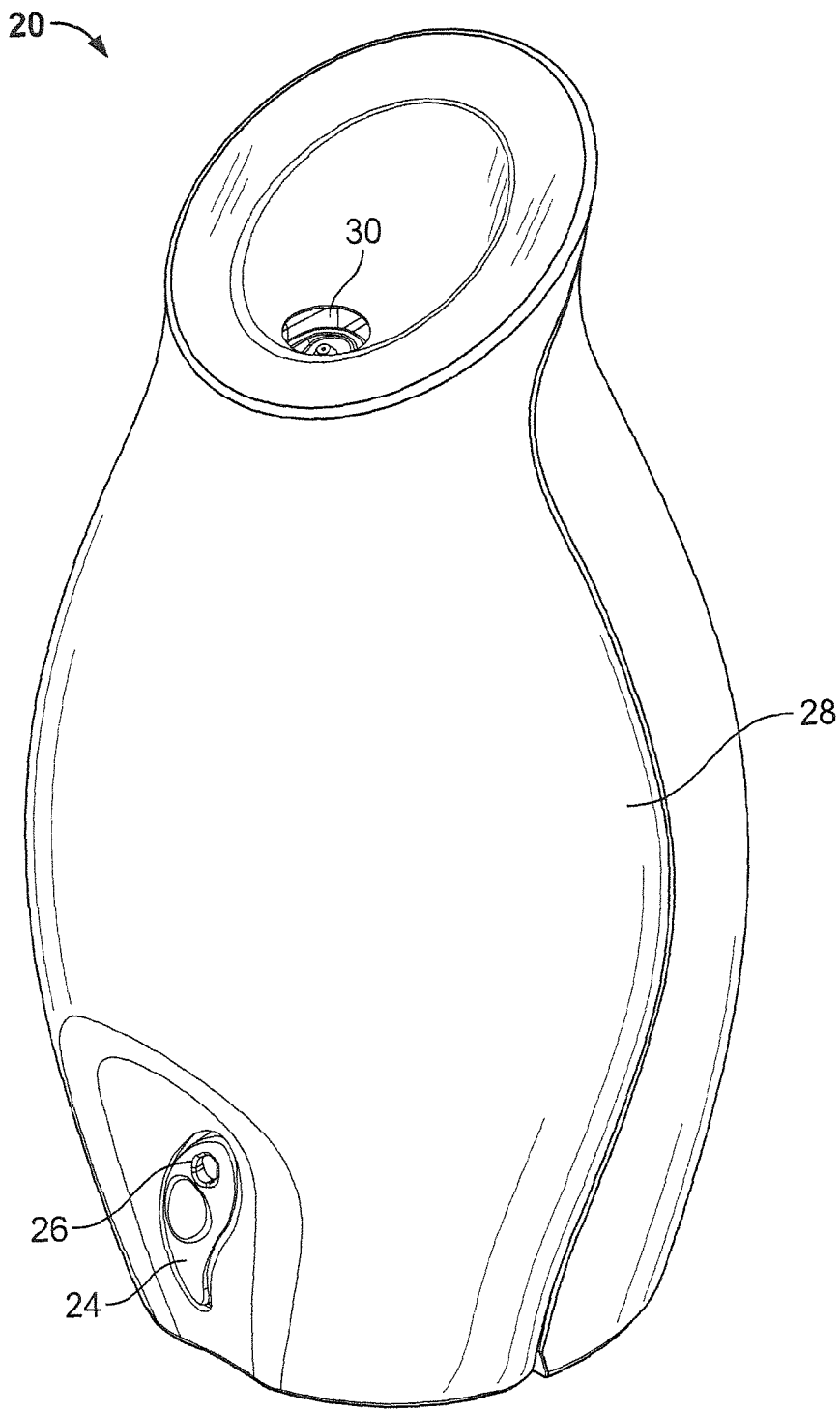
FIG. 1 comprises an isometric view of one type of volatile material dispenser that includes an application specific integrated circuit (ASIC) according to one aspect of the present invention.
Figure 3:
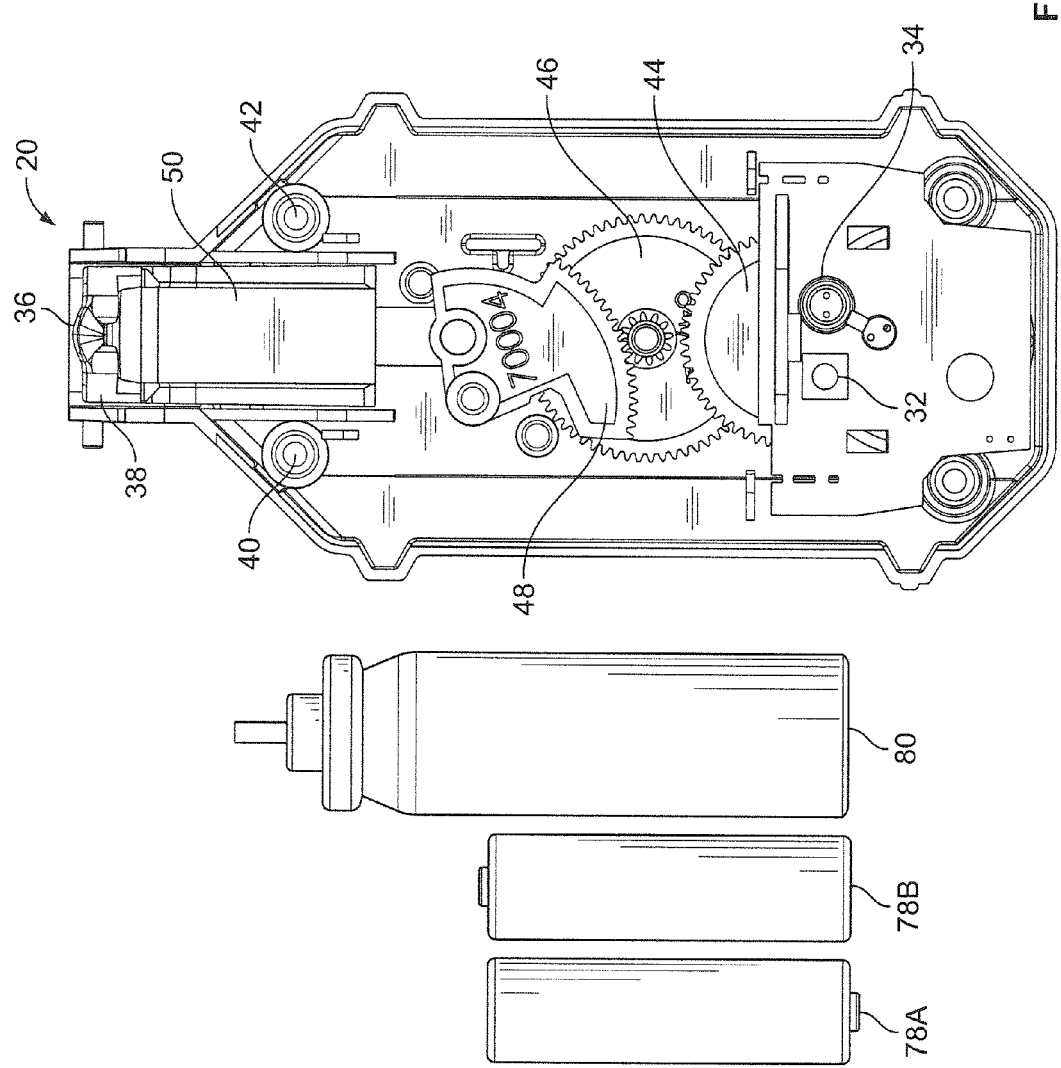
FIG. 3 comprises a front elevational view of the volatile material dispenser of FIG. 2.

FIGS. 1-3 illustrate a volatile material dispensing device 20 having an Application Specific Integrated Circuit (ASIC) 22 (FIG. 4) that implements a motion detecting system (described in greater detail in connection with FIG. 6 hereinafter). FIG. 1 illustrates the volatile material dispensing device 20 in the closed position. The embodiment includes an emission button 24, a lens 26, and a contoured outer shell 28 having a volatile material opening 30. In operation, a pressurized bottle of volatile material, such as a fragrance-filled bottle, and two (or a different number of) batteries (FIG. 5) are disposed within the outer shell 28.

In general, the ASIC 22 operates in conjunction with a detector. The detector includes a detecting device that detects a proximity condition and develops a parameter of electric power related thereto and a parameter measuring device is coupled to the detecting device. The parameter measuring device comprises a parameter detector, and an analog-to-digital converter (ADC) is coupled to the parameter detector and operative in one of a plurality of operational ranges to develop a digital representation of the parameter. The parameter measuring device further includes a range selector coupled between the ADC and the parameter detector that is operative to cause the parameter detector to develop an output signal magnitude representative of the parameter of electric power wherein the output signal magnitude is within one of the operational ranges of the ADC.

Referring again to FIGS. 2 and 3, an actuator assembly is disposed within the volatile material dispensing device 20 of FIG. 1. The actuator assembly includes a material dispensing button 32 coupled to an electrical switch (described in greater detail hereinafter with respect to FIG. 5), an optical sensor 34, a further volatile material opening 36, bottle support structures 38, cover attachment bores 40 and 42, actuator gears 44, 46, and, 48, an actuator arm 50, and a motor M. Further, FIGS. 2 and 3 depict two batteries 78A and 78B for use in the present device 20. Surfaces defining the cover attachment bores 40 and 42 support the contoured cover 28 of FIG. 1 when the latter is covering the device illustrated in FIGS. 2 and 3. The bottle support structures 38 support a bottle or container 80 of volatile material in the device 20.

When operating in one or more modes of operation, a volatile material is dispensed from the bottle 80 of volatile material disposed in the device. The actuator gears 44, 46, and 48 rotate upon operation of the motor M. The gear 44 is coupled to the axle (not shown) of motor M. The gear 46 is coupled between the gear 44 and the gear 48. The gear 48 is coupled to the actuator arm 50, which controls the emission of volatile material from the bottle 80 when the bottle 80 is disposed within the device of FIGS. 1-3 and supported by the bottle support structures 38. Specifically, when the motor M is rotating in a forward direction, the gears 44 and 46, rotate causing gear 48 to cause the actuator arm 50 to press on the actuator valve of the bottle 80 downwardly, thereby opening the valve and permitting pressurized volatile material to escape and travel upwardly from the bottle 80 as a spray.

The optical sensor 34 comprises a photosensitive device that detects ambient light falling on the sensor. This ambient light may be indicative of the presence or absence of motion in the vicinity of the sensor. The optical sensor 34 preferably comprises the phototransistor Q shown in FIG. 5. In one or more modes of operation, detection of movement by the optical sensor 34 may cause the motor M to be operated to discharge volatile material from the bottle 80 through the aligned volatile material openings 30 and 36, as noted in greater detail hereinafter.

The volatile material dispensing device 20 is described in greater detail in Furner et al., U.S. patent application Ser. No. 12/796,440, filed Jun. 8, 2010, entitled "Compact Spray Device", owned by the assignee of the present application and the disclosure of which is incorporated by reference herein.

Figure 4:
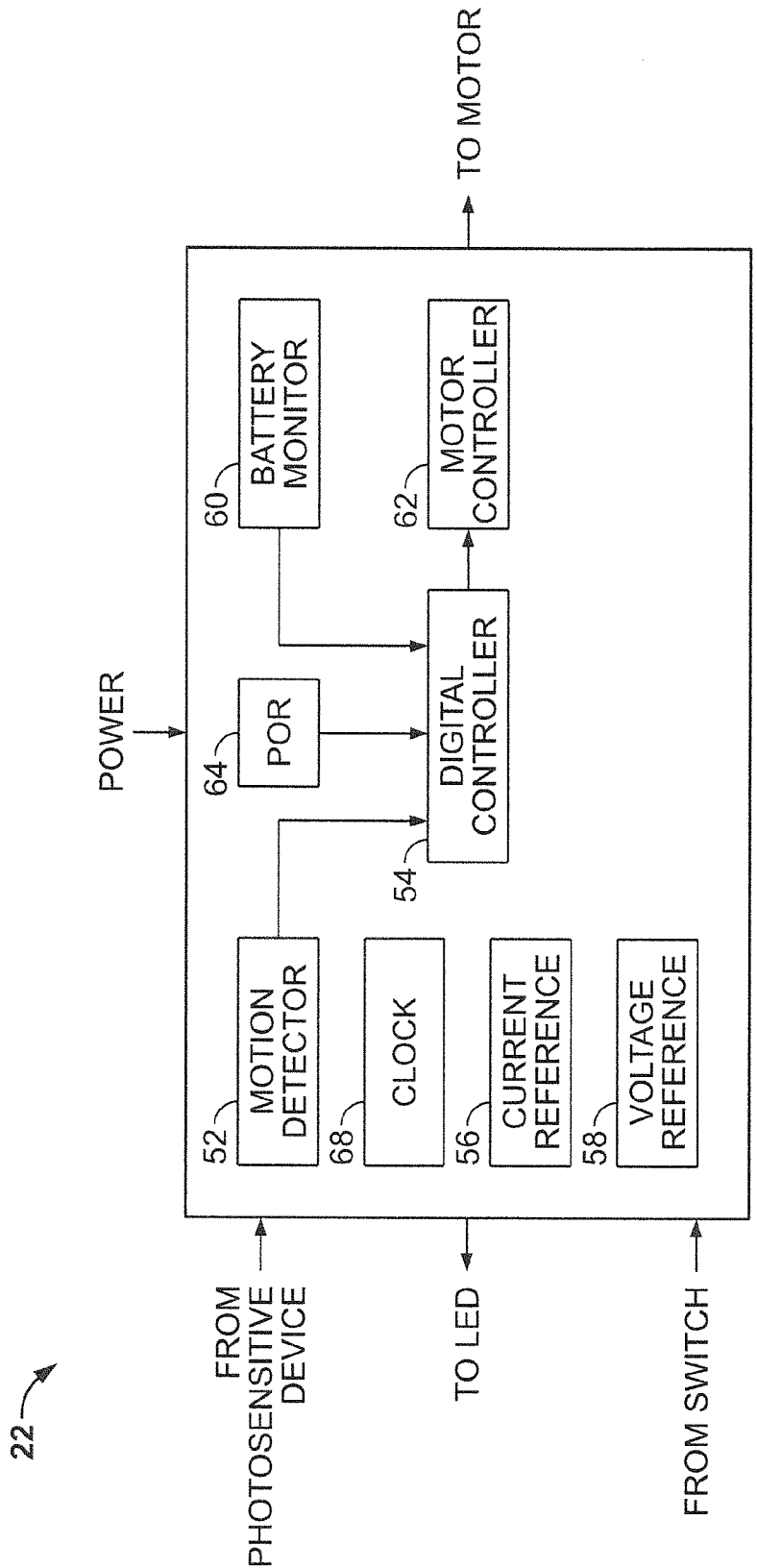
FIG. 4 comprises a generalized block diagram of the ASIC of the present invention.

Referring next to FIG. 4, the ASIC 22 includes a motion detector 52, a digital controller 54, a current reference 56, a voltage reference 58, a battery monitor 60, a motor controller 62, a power on reset ("POR") controller 64, and a clock 68. The motion detector 52 is in communication with an external photosensitive device and the digital controller 54. The motor controller 62 is in communication between the digital controller 54 and the motor M of FIG. 5. The ASIC 22 further receives an input from the electrical switch SW1 (FIG. 5) as noted in greater detail hereinafter and receives power from the batteries, which preferably comprise two series-connected AA size cells. The batteries preferably supply power through multiple input terminals or pads $V_{cc1}$, $V_{cc2}$, and $V_{cc3}$ and $GND_1$, $GND_2$, and $GND_3$ to the ASIC 22 and further supply power to various other external electrical components.

Figure 5:
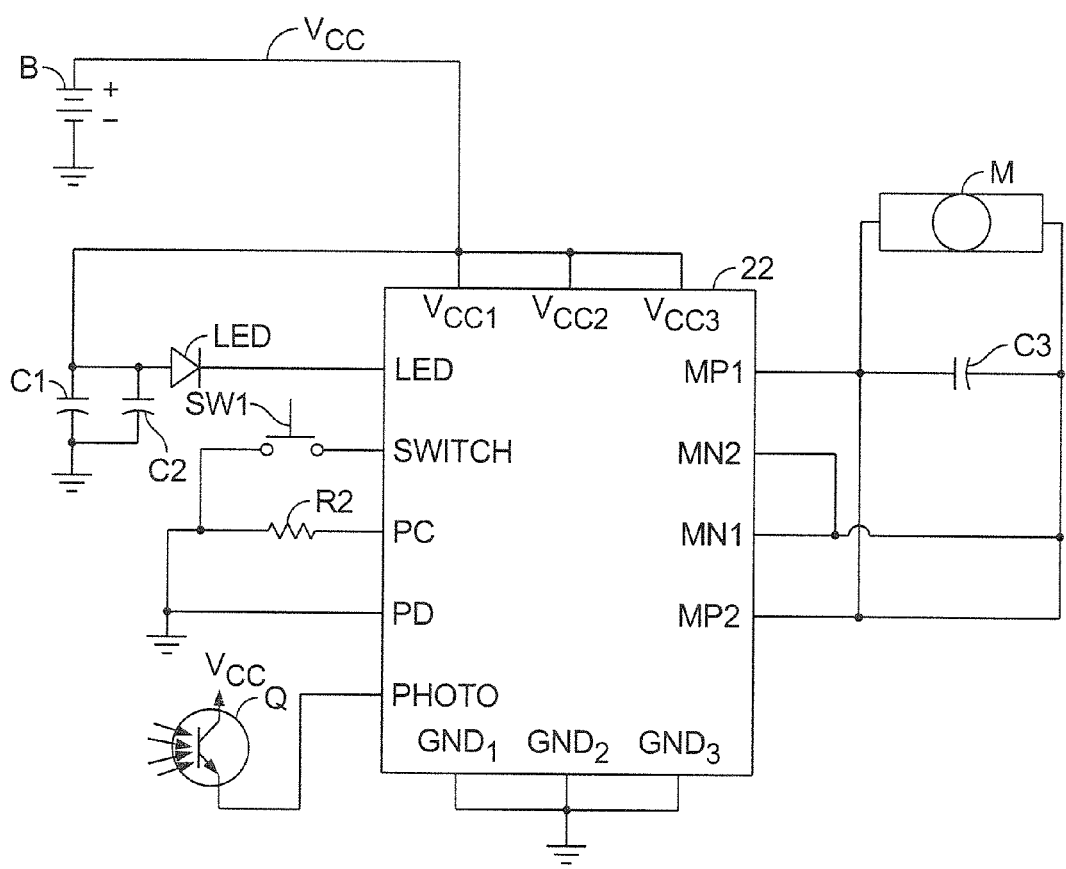
FIG. 5 comprises a schematic diagram of an electrical circuit utilizing the ASIC of FIG. 4 that may control the volatile material dispenser of FIG. 1.

Referring to FIGS. 4 and 5, in operation, the battery monitor 60 monitors the batteries, and when a parameter of the power supplied by the batteries reaches a first threshold condition, the battery monitor 60 shuts down the ASIC 22. In a preferred embodiment, the first threshold condition is reached when the output voltage of the batteries drops to a threshold voltage equal to 2.0 volts. To avoid unnecessary shutdowns due to anticipated abrupt drops in power, the battery monitor 60 is disabled and does not operate to shut down the ASIC 22 when the motor controller 62 is causing the motor M to run, even if the first threshold condition arises during such time.

The POR 64 resets the digital controller 54 when the power parameter reaches a second threshold condition. Furthermore, the POR 64 may reset the digital controller 54 such that the ASIC 22 changes to a different state of operation. Examples of different states are shown in FIGS. 7-10. In the preferred embodiment, the second threshold condition is reached when the output voltage of the batteries drops to a threshold voltage equal to 1.4 volts.

Also during operation, the motion detector 52 determines the presence or absence of motion within the vicinity of the photosensitive device. Light incident on the photosensitive device develops a parameter of electric power related to such light. In a preferred embodiment of the present invention, the photosensitive device comprises a bipolar junction NPN phototransistor and the parameter of electric power comprises the emitter current magnitude $I_{ph}$ of the phototransistor. $R_{ref}$ is a reference emitter load resistance. The emitter current of the photosensitive device is provided to an input terminal or pad PHOTO of the ASIC 22 (seen in FIG. 5). As described in greater detail hereinafter, the motion detector 52 determines that motion has been detected when the phototransistor emitter current magnitude changes by 8% from a steady state value after being filtered above 10 Hz.

In operation, the digital controller 54 activates and deactivates the motor controller 62. In a preferred embodiment, the motor controller 62 includes all of the components required to operate the motor M. Specifically, in a preferred embodiment, the motor controller 62 implements the functionality of a bidirectional H-bridge motor controller. The motor M controls the volatile material dispenser of FIGS. 1-3 such that a volatile material is emitted in response to the detection of motion within the vicinity of the volatile material dispenser and/or on a timed basis, as noted in greater detail hereinafter.

The digital controller 54 also provides current to an external light emitting diode LED (FIG. 5) via a terminal or pad LED of the ASIC 22 in response to one or more detected condition(s). For example, when the motion detector 52 flags the occurrence of a threshold condition, the digital controller 54 supplies a constant current to the LED for a predetermined period of time (provided the combined voltages of the batteries is sufficient to prevent a shutdown or reset as described above), such that the luminosity of light developed by the LED is constant during such time.

A terminal or pad SWITCH of the ASIC 22 is coupled by the switch SW1 (seen in FIG. 5) to ground. The switch SW1 initiates an interrupt to cause the motor controller to operate the external motor so that volatile material is immediately dispensed.

The clock 68 preferably comprises an internal R-C oscillator having a typical operating frequency of 160 k Hz. The clock 68 provides all of the timing signals to the ASIC 22. The current reference 56 and the voltage reference 58 supply reference current and voltage values to other components of the ASIC 22.

FIG. 5 illustrates further electrical components coupled to the ASIC 22 according to a first embodiment. Filtering capacitors C1 and C2 are connected between Vcc (i.e., the positive voltage developed by the batteries) and ground and further capacitor C3 is connected across the terminals of the motor. A first pair of output terminals or pads MP1 and MP2 are connected to the first terminal of the motor and a second pair of terminals or pads MN1 and MN2 are connected to the second terminal of the motor. A resistor R2 is coupled between an input terminal or pad PC and a further input terminal or pad PD is coupled to ground. The circuit diagram of FIG. 5 results in operation of the ASIC 22 according to the state diagram of FIG. 7.

Figure 5A:
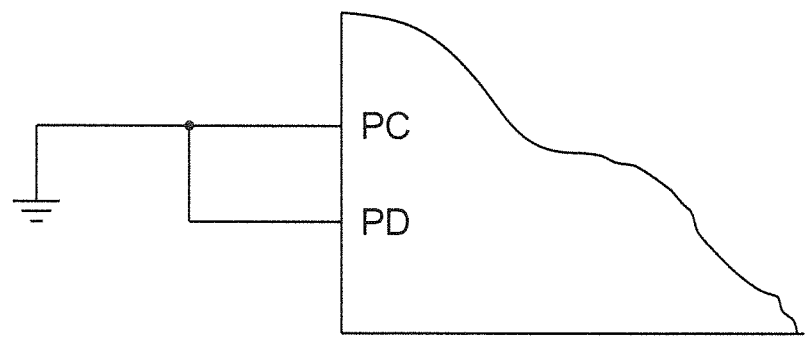
FIGS. 5A and 5B comprise schematic diagrams of alternative electrical circuits utilizing the ASIC of FIG. 4 that may control the volatile material dispenser of FIG. 1.
Figure 8:
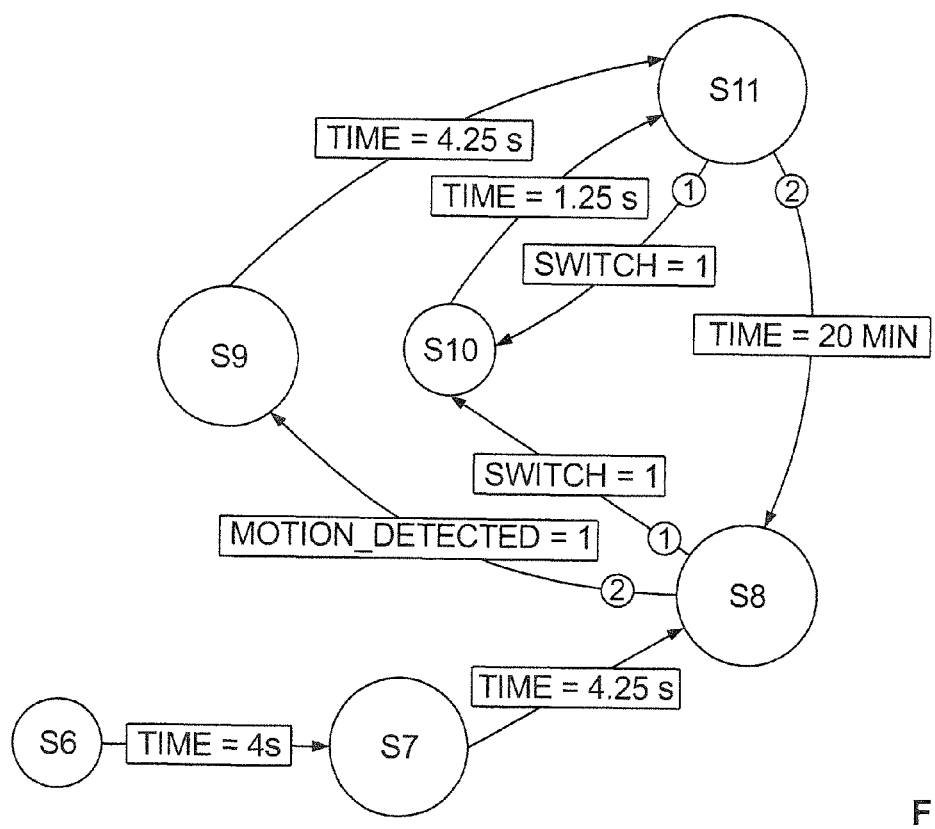
FIG. 8 comprises a state diagram of an alternative mode of operation as implemented by the ASIC of FIG. 5A.

FIG. 5A illustrates a modification to the circuit diagram of FIG. 5 to cause the ASIC to operate according to the state diagram of FIG. 8. In this case, the input terminal PC is coupled directly to ground. All other connections and components are identical to those shown in FIG. 5.

Figure 5B:
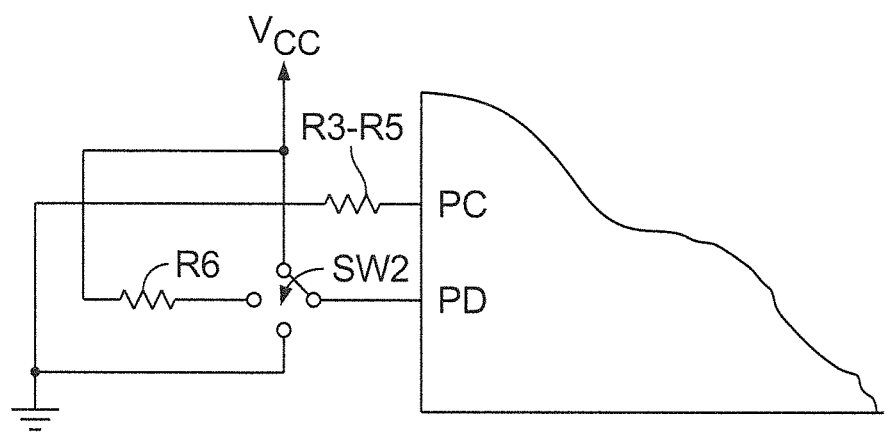
Figure 9:
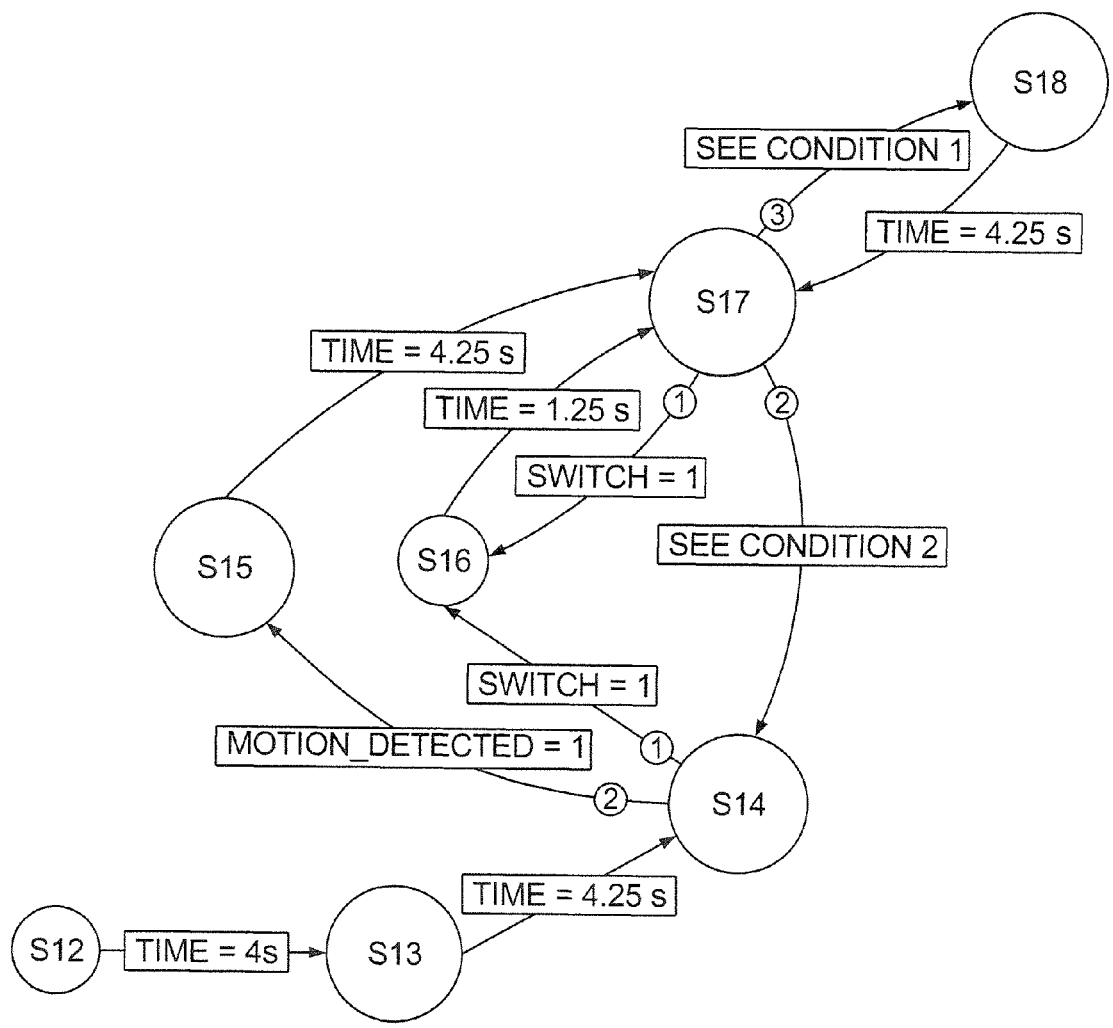
FIG. 9 comprises a state diagram of yet another alternative mode of operation as implemented by the ASIC of FIG. 5B.

FIG. 5B illustrates yet another modification to the circuit diagram of FIG. 5 to cause the ASIC to operate according to the state diagram of FIG. 9. In this embodiment, the input terminal PC is coupled by one of three differently-valued resistors R3-R5 to ground. Further, the input terminal PD is coupled by a single-pole, three-throw (or equivalent) switch SW2 directly to Vcc, or to ground potential, or to Vcc through a resistor R6. As with FIG. 5A, all other connections and components are identical to those shown in FIG. 5.

Because the relatively high current demands of the motor controller are integrated in the ASIC 22, provision must be made to adequately supply such current magnitudes. As seen in FIG. 5, the battery B is connected to the ASIC 22 by multiple wires through multiple terminals. These multiple wires permit an adequate amount of current to be supplied to the ASIC 22 given the greater amount of discrete elements that are included within the ASIC 22. Further, this permits the ASIC 22 to be reduced in size as compared to an integrated circuit having only single sets of connections to a power source and to a motor, because the sizes of the terminals may be kept small. Still further, such an arrangement permits the use of relatively inexpensive wires, such as copper or aluminum, as opposed to more expensive wiring, such as gold. Finally, the additional wires permit the use of wires having a smaller diameter than if a single pair of wires were used to connect the power source to the ASIC 22 and a single pair of wires were used to connect the motor M to the ASIC 22.

The phototransistor Q of FIG. 5 preferably comprises a bipolar junction NPN phototransistor having a maximum current of 500 microamps and a minimum current of 5 microamps. The motor M preferably operates at a minimum voltage of 1.8V. In an embodiment of the present invention, the motor M comprises a DC motor. In this embodiment, the capacitor C3 acts as a voltage filter. Alternatively, the motor M may comprise an AC motor. In this embodiment capacitor C3 is selected to filter sudden rises and drops in voltage to the motor M during transient operation and provide power factor correction so that only real power is transferred to the motor M.

Figure 6:
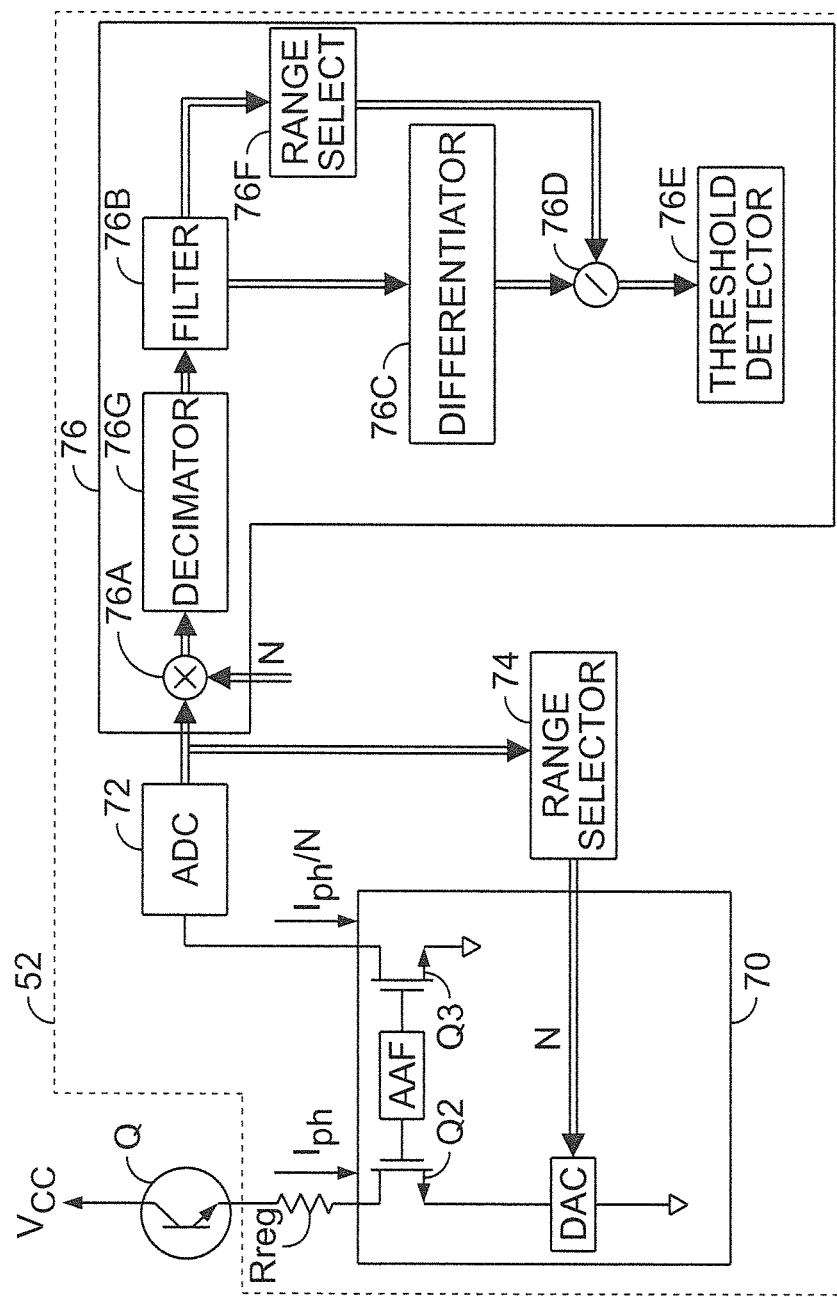
FIG. 6 comprises a block diagram of a motion detecting system as implemented by the ASIC of any of FIGS. 5, 5A, and 5B that utilizes an auto-ranging feature.

FIG. 6 illustrates the motion detector 52 and photosensitive device Q in greater detail. The motion detector 52 comprises a parameter detector 70, an analog to digital converter (ADC) 72, a range selector 74, and a signal processing module 76. The signal processing module 76 includes a multiplier 76A, a filter 76B, a differentiator 76C, a divider 76D, and a threshold detector 76E in the form of a comparator. The ADC 72 preferably comprises an 8-bit successive approximation register A/D converter (SARADC).

In operation, the emitter current magnitude of the phototransistor Q is representative of the emitter current of the phototransistor Q. As shown in FIG. 6, the parameter detector 70 preferably comprises a dual nmos current mirror including FET's Q2 and Q3, wherein a controllable switch is connected between the input FET Q2 and ground, and wherein an antialiasing filter AAF is connected between the gates of the two FET's Q2 and Q3. The controllable switch may comprise any suitable transistor or other device.

The parameter detector 70 duplicates a representation of the parameter of electric power and provides this representation to the range selector 74. The representation is equal to the emitter current $I_{ph}$ divided by a factor N determined by the range selector 74. The range selector controls the switch of the parameter detector 70 such that the output magnitude of the parameter detector 70 is within one of a plurality of operational ranges of the ADC 72. The plurality of operational ranges of the ADC 72 together define the total operational range of the ADC 72. Specifically, the range selector 74 causes the output magnitude of the parameter detector 70 to be centered as nearly as possible within one of the operational ranges of the ADC 72 so that the A/D conversion is accurately accomplished. Further, the range selector 74 permits an accurate digital representation of the parameter of electric power using a low resolution A/D converter.

The factor N preferably comprises a binary weighted number. The switch connected between Q1 and ground preferably comprises a DAC, which is preferably a set of switches in parallel, such that the output of the current mirror is a representation scaled by the factor N. In the preferred embodiment, N is a 4-bit binary weighted number, such that the output of the current mirror is scaled by a total of 16 levels. A low pass filter, AAF, is connected between the gates of Q1 and Q2 such that the output current of the current mirror is filtered for low frequencies. Preferably, the AAF comprises a low pass filter and, more preferably, an RC filter. Filtering the output current of the current mirror in this manner enables the ADC 72 to adequately oversample the resultant signal using a low pass filter, internal to the ADC 72, having a larger cutoff frequency. This reduces the size of the internal low pass filter on an integrated chip. The multiplier 76A of the signal processing unit 76 multiplies the output of the ADC 72 by the factor N to rescale the magnitude of the signal. This multiplied digital representation of the output of the parameter detector 70 is input into a decimator 76G. The decimator 76G reduces the amount of data that is input into the filter 76B of the signal processing unit 76. This is done to take into account oversampling by the ADC 72. The filter 76B preferably comprises a D/A converter in conjunction with a low pass filter. The cutoff frequency of the filter 76B satisfies the Nyquist criterion so that the resulting analog signal is accurately reproduced.

The analog signal is processed by the differentiator 76C of the signal processing unit 76. The differentiator 76C develops the first derivative of the inputted analog signal with respect to time and provides this differentiated signal to the divider 76D of the signal processing unit 76. The divider 76D divides this signal by N as provided by a range select module 76F. The division by the divider 76D rescales the signal in respect to the multiplied signal output of the multiplier 76A. The signal processing unit 76 determines if a threshold condition is satisfied at the threshold detector 76E. In the preferred embodiment, this threshold condition is representative of a low pass filtered change in the parameter of light incident on the photosensitive device Q with respect to time, and an indication that the threshold has been reached represents whether motion is occurring within the vicinity of the photosensitive device Q.

Figure 7:
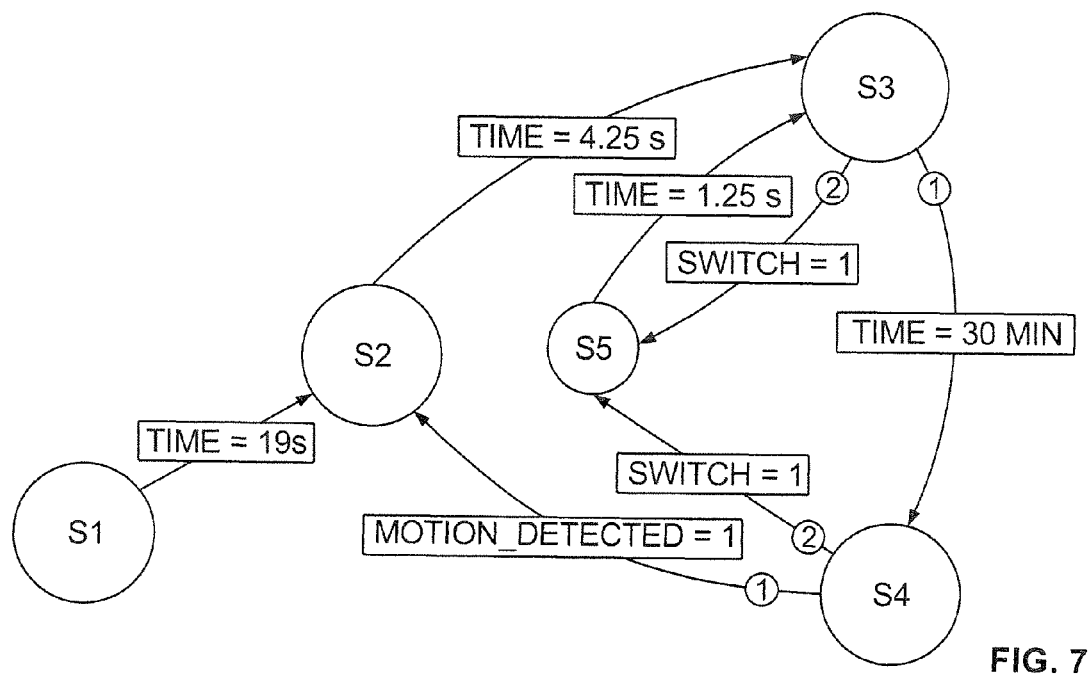
FIG. 7 comprises a state diagram of a particular mode of operation as implemented by the ASIC of FIG. 5.

Referring next to FIG. 7, as noted previously, the state machine diagram shown therein illustrates operation of the ASIC 22 in a first mode. When power is first supplied to the ASIC 22, the ASIC assumes a state S1. At state S1, the ASIC 22 provides current to the external LED at a constant current level for a predetermined period of time. In one embodiment, the predetermined period is 18.5 seconds. Upon expiration of the predetermined period plus an additional period of time (e.g., 0.5 seconds), the ASIC 22 proceeds to a state S2. At S2, the ASIC 22 checks the power supplied by the batteries. In one embodiment, the ASIC 22 determines whether the battery voltage is above a threshold voltage using the battery monitor 60. In a preferred embodiment, this threshold level is 2 volts. Further, the ASIC 22 turns the motion detector 52 off and causes the LED to blink on and off a predetermined number of times. In one embodiment, the ASIC 22 turns the LED on for 500 milliseconds, and then off 500 milliseconds, and repeats for a total of three on/off cycles. Still further, the ASIC 22 operates the motor M to cause the emission of volatile material. For example, the ASIC 22 controls the motor M to move in the forward direction for 1000 milliseconds, then stop for 150 milliseconds, and then move in the backward direction for 400 milliseconds, which results in the emission of fluid. In one embodiment, the valve of the container is metered to emit a predetermined volume of fluid. In other embodiments, the cycling of the motor, i.e., the time the motor spends in a forward, stationary, and backwards condition, results in a variable volume of fluid to be dispensed dependent on the time spent in each condition. After a predetermined amount of time following transition to the state S2, the ASIC 22 proceeds to state S3. In a preferred embodiment, this predetermined amount of time is 4.25 seconds.

At state S3, the ASIC 22 turns off the motion detector 52. Further, the ASIC 22 turns the external LED on using a pulse width mode of operation at a 50% duty cycle. Still further, the ASIC 22 initiates operation of a lockout timer. The lockout timer causes the ASIC 22 to remain at the state S3 for a predetermined amount of time and then the ASIC 22 proceeds to a state S4. In a preferred embodiment, this predetermined amount of time is 30 minutes. When the ASIC 22 is at state S3, the ASIC 22 can alternatively proceed to a state S5 when the switch SW1 is closed by a user.

At state S4, the ASIC 22 utilizes a periodic sensing operation to detect the presence or absence of motion using the motion detector 52. In a preferred embodiment, the ASIC 22 periodically detects the presence of motion every 5 seconds using the motion detector 52. Specifically, in a preferred embodiment, the ASIC 22 cycles the following operations every five seconds: (1) ignore the output of the photosensitive device Q and turn the external LED off during a first 0.35 second interval, (2) sense the output of the photosensitive device Q using the motion detector 54 and turn the external LED off for a successive 4.5 second interval, and (3) ignore the output of the photosensitive device Q and turn the LED on for the successive 0.15 second interval. Control remains in the state S4 until motion is detected, whereupon a transition occurs back to the state S2. Control may instead pass to the state S5 from the state S4 if the switch SW1 is closed by the user.

At state S5, the ASIC 22 turns the motion detector 52 off. Further, the motor is preferably actuated as in the state S2 by operating the motor in the forward direction for 1000 milliseconds, stopping the motor for 150 seconds, and then operating the motor in the reverse direction for 400 milliseconds. Further, the ASIC 22 resets the lockout timer noted in connection with the state S3. Control transitions back to the state S3 from the state S5 a predetermined time period following transition into the state S5, such as 1.25 seconds.

FIG. 8 depicts the ASIC 22 operating in accordance with another mode. At a state S6, the ASIC 22 turns the external LED on for a predetermined time. In a preferred embodiment of the invention, this time is 3.5 seconds. After the predetermined time plus an additional time, such as 0.5 seconds, the ASIC 22 proceeds to a state S7, which is preferably similar or identical to the state S2 described above. After a predetermined amount of time, such as 4.25 seconds, the ASIC 22 proceeds to state S8.

The state S8 is preferably similar or identical to the state S4 of FIG. 7 described above. While in the state S8, control passes to a state S9 if motion is detected or control passes to a state S10 if the switch SW1 is closed by the user. The state S9 is identical to the state S7, except that the battery voltage is not checked in the state S9. Preferably, the state S10 is similar or identical to the state S5 of FIG. 7. Control passes from the state S9 to a state S11 after passage of a predetermined period of time, such as 4.25 seconds. Control passes to the state S11 from the state S10 after the passage of a further predetermined period of time, such as 1.25 seconds after control is transitioned to the state S10. The state S11 is preferably similar or identical to the state S3 of FIG. 7.

Control passes from the state S11 back to the state S10 if the switch SW1 is closed by the user. Control passes from the state S11 back to the state S8 once a particular period of time has elapsed since control passed to the state S11, such as 20 minutes.

FIG. 9 illustrates the ASIC 22 operating in yet another mode. Upon powering the ASIC 22, the ASIC 22 operates in a state S12 and turns the external LED on. Control remains in the state S12 for a predetermined period of time, such as four seconds, whereupon control transitions to a state S13, which is preferably similar or identical to the states S2 and S7 of FIGS. 7 and 8, respectively. After a certain time, such as 4.25 seconds, control passes to a state S14, which is preferably similar or identical to the states S4 and S8 of FIGS. 7 and 8, respectively. If motion is detected while in the state S14, control passes to a state S15, which preferably is similar or identical to the state S9 of FIG. 8. If the switch SW1 is closed by the user while the ASIC 22 is in the state S14, control transitions to a state S16, which preferably is similar or identical to the states S5 and S10 of FIGS. 7 and 8, respectively. Control passes from the states S15 and S16 to a state S17 after passage of particular periods of time, such as 4.25 seconds and 1.25 seconds, respectively. The state S17 is preferably similar or identical to the states S3 and S11 of FIGS. 7 and 8, respectively.

Control passes from the state S17 to the state S16 if the user closes the switch SW1. Still further, control passes to a state S18 from the state S17 if a first condition noted in greater detail hereinbelow is satisfied. Also, control transitions from the state S17 to the state S14 upon the occurrence of a second condition noted in greater detail hereinafter. Control returns from the state S18 to the state S17 after the passage of a certain period of time, such as 4.25 seconds. The state S18 is preferably similar or identical to the state S15 with the additional function that the lockout timer is not reset in the state S18.

In the machine states illustrated in FIG. 9, the first and second conditions are dependent on which resistance R3-R5 is connected to the terminal PC and the position of the switch SW2 connected to the terminal PD of the ASIC 22. Tables 1-3 following illustrate that the first condition either never arises or arises on a timed basis following transition into the state S17. The second condition arises at one of a plurality of times following passage of control to the state S17 as noted. The positions of the switch SW2 are referred to as low, middle, and high positions (as seen in FIG. 5B) in the following three tables.

TABLE 1

| PC connected to R3 | | | |
|---|---|---|---|
| Condition | Low | Middle | High |
| Condition 1 | Never | Never | Never |
| Condition 2 | 15 mins. | 20 mins. | 30 mins. |

TABLE 2

| PC connected to R4 | | | |
|---|---|---|---|
| Condition | Low | Middle | High |
| Condition 1 | Never | 15 and 30 mins | 10, 20, 30 mins |
| Condition 2 | 30 mins. | 30 mins. | 30 mins. |

TABLE 3

| PC connected to R5 | | | |
|---|---|---|---|
| Condition | Low | Middle | High |
| Condition 1 | Never | 20 mins | 20, 40 mins |
| Condition 2 | 20 mins. | 40 mins. | 60 mins. |

In the preferred embodiment, R3 has a resistance value of 10 kΩ, R4 has a resistance value of 20 kΩ, and R5 has a resistance value of 160 kΩ.

Figure 10:
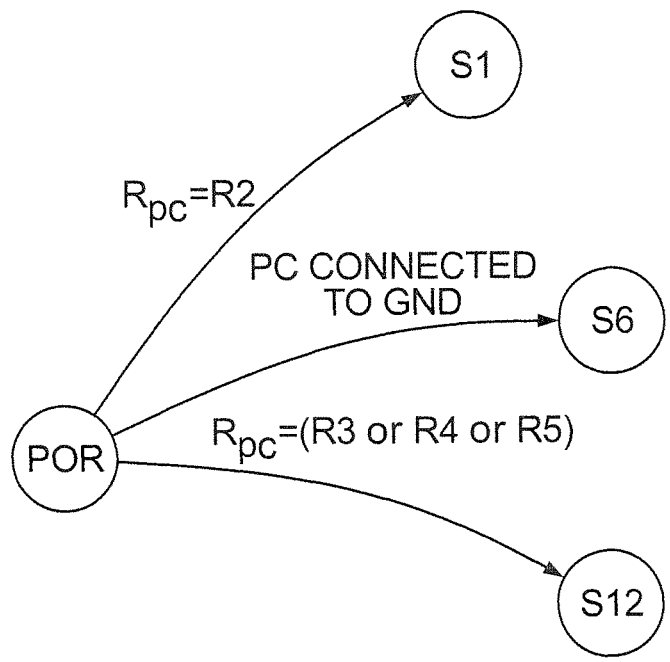
FIG. 10 comprises a state diagram of a main control mode upon initiation of operation as implemented by the ASIC of the modes of operation of any of FIGS. 5, 5A, and 5B.

FIG. 10 illustrates a state machine of the ASIC 22 when the ASIC 22 begins operation and proceeds to a particular state machine of operation illustrated, for example, in any one of FIGS. 7-9. Upon activation of the POR 64 of FIG. 4, or upon powering the ASIC 22, the state machine of operation is dependent on the resistance connected to pin PC of FIG. 5. The system begins at state POR, and remains at this state for a predetermined time. In a preferred embodiment, this time is approximately one second. At this time, the ASIC 22 proceeds to the state S1 of FIG. 7 when the resistance connected to pin PC is equal to R2. In a preferred embodiment of the invention, R2 has a resistance value of 40 kΩ. When pin PC is connected to GND, the ASIC 22 proceeds to the state S6 illustrated in FIG. 8. When PC is connected to R3, R4, or R5, the ASIC 22 proceeds to the state S12 of FIG. 9.

Figure 11:
FIG. 11 comprises a state diagram of an interrupt operation applicable to all modes of operation as implemented by the ASIC of any of FIGS. 5, 5A, and 5B.

FIG. 11 illustrates a machine state diagram of the interrupt operation of the ASIC 22 when the battery level drops below a threshold level. In a preferred embodiment of the invention, the battery level is sensed by the battery monitor 60 as described above, which sends a signal flag to the digital controller 54 to shut down the ASIC 22 of FIG. 4. The machine state diagram of FIG. 11 applies to any state of FIGS. 7-10 where the external motor is not operating, and these states are represented by state S19. When the ASIC is not operating the motor and the battery voltage level drops to a threshold value, the ASIC 22 will proceed to state S20. At this state the ASIC 22 stops operation.

INDUSTRIAL APPLICABILITY

The ASIC 22 is a device that can handle large current magnitudes, yet is small in size. The ASIC 22 is usable with relatively inexpensive wiring and implements a fully-featured control with very few external parts. Also, the ADC 72 can be a relatively simple module in the sense that the resolution thereof can be limited in view of the use of the auto-ranging feature.

Numerous modifications will be apparent to those skilled in the art in view of the foregoing description. Accordingly, this description is to be construed as illustrative only and is presented for the purpose of enabling those skilled in the art to make and use what is herein disclosed and to teach the best mode of carrying out same. The exclusive rights to all modifications which come within the scope of this disclosure are reserved.

We claim:

1. A detector, comprising:
a detecting device that detects a proximity condition and develops a parameter of electric power related thereto; and
a parameter measuring device coupled to the detecting device including:
a parameter detector having a current mirror,
an analog-to digital converter (ADC) coupled to the parameter detector, the ADC including a plurality of operational ranges and operative in one of the plurality of operational ranges to develop a digital representation of the parameter, and
a range selector coupled between the ADC and the parameter detector and operative to cause the parameter detector to develop an output signal magnitude representative of the parameter of electric power wherein the output signal magnitude is within one of the operational ranges of the ADC.

2. The detector of claim 1, wherein the ADC comprises a successive approximation register A/D converter (SARADC).

3. The detector of claim 2, further including a signal processing unit coupled to the SARADC wherein the signal processing unit develops a detector output signal.

4. The detector of claim 3, wherein the signal processing unit comprises a multiplier, a filter, a differentiator, and a comparator.

5. The detector of claim 4, wherein the signal processing unit further includes a divider coupled between the differentiator and the comparator.

6. The detector of claim 1, wherein the detecting device comprises a phototransistor and the parameter of electric power comprises a magnitude of emitter current of the phototransistor.

7. The detector of claim 6, wherein the current mirror develops an output signal representative of the magnitude of phototransistor current magnitude.

8. The detector of claim 7, wherein the current mirror includes an input transistor coupled to the phototransistor, an anti-aliasing filter coupled to the input transistor, and an output transistor coupled between the anti-aliasing filter and the ADC and further including a switch coupled to a main current path electrode of the input transistor and to a main current path electrode of the output transistor and a range selector coupled between an output of the ADC and the switch for controlling the switch.

9. A detector, comprising:
a phototransistor that detects a proximity condition and develops a magnitude of emitter current related thereto; and
a parameter measuring device coupled to the phototransistor including:
a parameter detector having a current mirror,
an analog-to digital converter (ADC) coupled to the parameter detector and operative in one of a plurality of operational ranges to develop a digital representation of the magnitude of emitter current,
a range selector coupled between the ADC and the parameter detector and operative to cause the current mirror to develop an output signal magnitude representative of the magnitude of emitter current wherein the output signal magnitude is within one of the operational ranges of the ADC,
wherein the current mirror includes an input transistor coupled to the phototransistor, an anti-aliasing filter coupled to the input transistor, and an output transistor coupled between the anti-aliasing filter and the ADC and further including a switch coupled to a main current path electrode of the input transistor and a range selector coupled between an output of the ADC and the switch for controlling the switch.

10. The detector of claim 1, wherein the output signal magnitude is centered within one of the plurality of operational ranges of the ADC.

11. The detector of claim 1, wherein the plurality of operational ranges together define the total operational range of the ADC.

* * * * *